United States Patent [19]

Nagao et al.

[11] Patent Number: 4,536,443
[45] Date of Patent: Aug. 20, 1985

[54] MAGNETIC RECORDING MEDIUM

[75] Inventors: Makoto Nagao; Akira Nahara, both of Kanagawa, Japan

[73] Assignee: Fuji Photo Film Co., Ltd., Kanagawa, Japan

[21] Appl. No.: 536,049

[22] Filed: Sep. 26, 1983

[30] Foreign Application Priority Data

Sep. 29, 1982 [JP] Japan ............................ 57-170649

[51] Int. Cl.$^3$ .............................................. G11B 5/64
[52] U.S. Cl. .................................... 428/336; 360/134; 360/135; 360/136; 427/128; 427/132; 428/694; 428/900
[58] Field of Search ............... 428/694, 692, 900, 695, 428/336; 427/128, 132; 360/134, 135, 136

[56] References Cited

U.S. PATENT DOCUMENTS

| | | | |
|---|---|---|---|
| 4,343,834 | 8/1982 | Saito | 427/132 |
| 4,371,590 | 2/1983 | Izumi | 427/132 |
| 4,387,136 | 6/1983 | Saito | 428/694 |
| 4,418,126 | 11/1983 | Izumi | 428/694 |
| 4,450,186 | 5/1984 | Shinohara | 427/132 |
| 4,451,501 | 5/1984 | Nagao | 427/132 |
| 4,454,195 | 6/1984 | Fukuda | 427/132 |
| 4,477,488 | 10/1984 | Sugita | 427/132 |

Primary Examiner—Ellis P. Robinson
Attorney, Agent, or Firm—Sughrue, Mion, Zinn, Macpeak & Seas

[57] ABSTRACT

A magnetic recording medium comprises a non-magnetic substrate and at least one layer of obliquely deposited magnetic crystals which contains, as a main constituent, Co or a Co—Ni based alloy containing Cr in an amount within the range of 2 to 8 atom % and has a density of 5.0 g/cm$^3$ or more, said layer being formed on said non-magnetic substrate.

4 Claims, 2 Drawing Figures

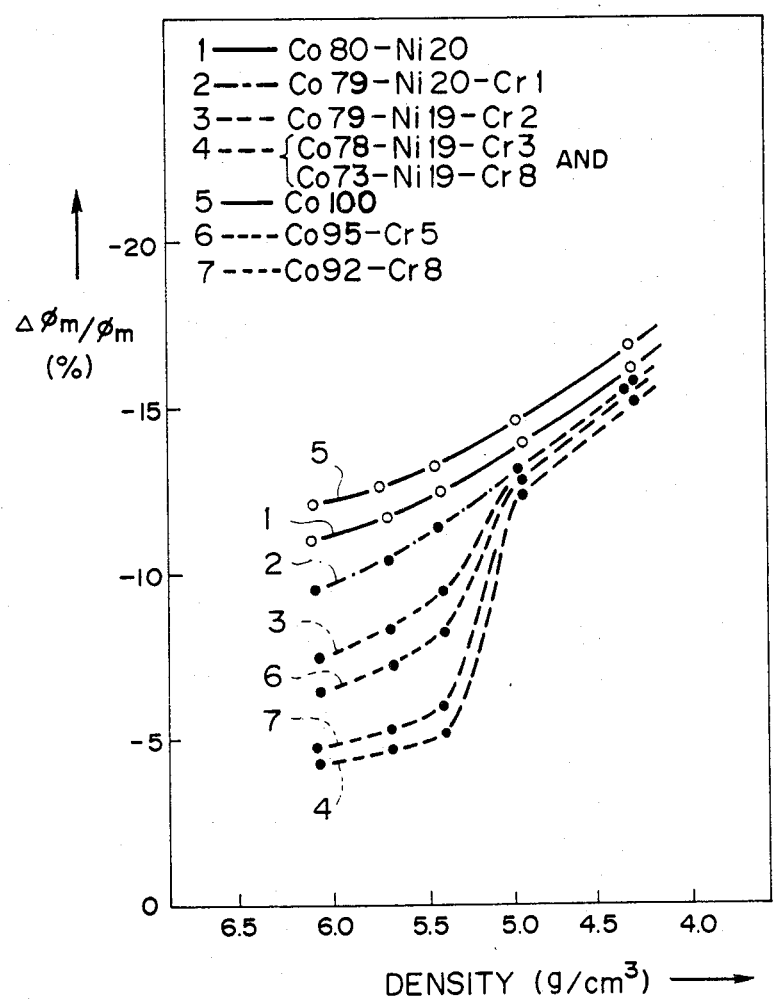

MAGNETIC RECORDING MEDIUM

BACKGROUND OF THE INVENTION

1. Field of the Invention

This invention relates to an improvement of a magnetic recording medium provided with at least one layer of obliquely deposited magnetic crystals wherein ferromagnetic columnar grains are formed on a substrate at an oblique angle with respect to the substrate by causing a stream of vapor obtained by heating and evaporating a ferromagnetic material to obliquely impinge upon the substrate in a vacuum.

2. Description of the Prior Art

Recently, there is desired a magnetic recording medium able to meet the strong demand for high density recording. Particularly, various efforts are being made to develop a thin metal film type magnetic recording medium suitable as a high density magnetic recording medium. To form a thin metal film, various methods such as vacuum deposition, ion plating, sputtering and wet plating are used. However, as a method of consistently making a high coercive force medium suitable for high density recording, an oblique incidence vacuum deposition method as disclosed in Japanese Patent Publication No. 41(1966)-19,389 is excellent.

In the oblique incidence vacuum deposition method, a stream of vapor obtained by heating and evaporating a ferromagnetic material such as Co, or Co—Ni is caused to impinge upon a non-magnetic substrate made of a high-molecular material or the like in a vacuum generally at an angle of 45° or more with respect to the line normal to the substrate, thereby forming ferromagnetic columnar grains on the substrate at an oblique angle with respect to the substrate. In this manner, at least one layer of obliquely deposited magnetic crystals is formed on the substrate.

FIG. 1 shows a continuous deposition apparatus used to make a magnetic tape by use of the aforesaid oblique incidence vacuum deposition method. In this apparatus, the minimum angle of incidence ($\theta$min) which is determined by the shapes and positions of a cylindrical cooling can 1, a deposition material 2 and a mask 3 is a very important factor determining the magnetic characteristics, particularly the coercive force Hc, of the obliquely deposited magnetic layer. For example, in order to obtain a high coercive force of about 1,000 Oe by use of Co or a Co—Ni alloy as the deposition material, it is generally necessary that the minimum angle of incidence ($\theta$min) be about 60° or more. However, when deposition is conducted at a minimum angle of incidence ($\theta$min) of 60° or more, the portion of the vapor stream interrupted by the mask 3 is increased, and the amount of the vapor stream deposited on the substrate is decreased markedly, resulting in a marked decrease in the deposition speed.

To eliminate the drawbacks of the aforesaid oblique incidence vacuum deposition method, is has been proposed to conduct oblique incidence vacuum deposition in the presence of oxygen or to add an impurity to the deposition material. In the method of conducting oblique incidence vacuum deposition in the presence of oxygen, it is possible to obtain a deposited magnetic layer exhibiting a high coercive force and, consequently, decrease the minimum angle of incidence ($\theta$min) in the deposition process. Namely, this method is suitable for increasing the coercive force of the obtained magnetic layer and decreasing the angle of incidence of the vapor stream of the deposition material. However, the Co or Co—Ni alloy film formed by the oblique incidence vacuum deposition method or the method of oblique incidence vacuum deposition in the presence of oxygen exhibits insufficient time stability, which constitutes an obstacle to putting the method to practical use. In order to increase the coercive force and improve the time stability of the Co or Co—Ni alloy film, an attempt has been made to add an impurity such as Cr to the Co or Co—Ni alloy deposition material. However, it is not yet possible to realize a sufficient improvement in the time stability. For example, when the amount of Cr added as an impurity is increased, the apparent time stability of the Co or Co—Ni alloy film obtained is somewhat improved. However, in order to obtain a desired level of time stability, it is necessary to add large amounts of Cr to the deposition material. As a result, the magnetic flux density and the electromagnetic transducing characteristics of the obtained magnetic layer become very low.

SUMMARY OF THE INVENTION

The primary object of the present invention is to provide a magnetic recording medium provided with at least one layer of obliquely deposited magnetic crystals, which exhibits excellent time stability and a high coercive force.

Another object of the present invention is to provide a magnetic recording medium provided with at least one layer of obliquely deposited magnetic crystals, which exhibits excellent electromagnetic transducing characteristics.

The magnetic layer formed by the oblique incidence vacuum deposition method comprises ferromagnetic columnar grains deposited obliquely with respect to the substrate. In general, when the angle of incidence of the vapor stream of the deposition material is large, the spaces between the ferromagnetic columnar grains become large. For example, when a vapor stream of an ordinary Co—Ni alloy is obliquely deposited at an minimum angle of incidence ($\theta$min) of 60°, the packing density of the ferromagnetic layer becomes about 0.5. Namely, the density of the obliquely deposited film actually obtained becomes about half the bulk density. The inventors studied the relationship between the packing density and the time stability of the magnetic layer and found that satisfactory time stability can be obtained when the amount of Cr added is within a specific range and the packing density of a Co—Cr or Co—Ni—Cr alloy film is 5.0 g/cm$^3$ or more.

The magnetic recording medium in accordance with the present invention comprises a non-magnetic substrate and at least one layer of obliquely deposited magnetic crystals which contains, as a main constituent, Co or a Co—Ni based alloy containing Cr in an amount within the range of 2 to 8 atom % and has a density of 5.0 g/cm$^3$ or more, and which is formed on said non-magnetic substrate.

The magnetic recording medium of the present invention exhibits excellent time stability, a high coercive force, and excellent electromagnetic transducing characteristics.

Since it is not always possible to accurately measure the packing density of the metal or alloy in the magnetic layer, the weight of the magnetic layer per unit volume, i.e. the density (in g/cm$^3$) is used in the present invention.

The present invention will hereinbelow be described in further detail with reference to the accompanying drawings.

BRIEF DESCRIPTION OF THE DRAWINGS

FIG. 2 is a graph showing the relationship between the density and the degree of thermal demagnetization ($\Delta\phi m/\phi m$) in various Co—Ni—Cr compositions.

DETAILED DESCRIPTION OF THE INVENTION

Figure 1:
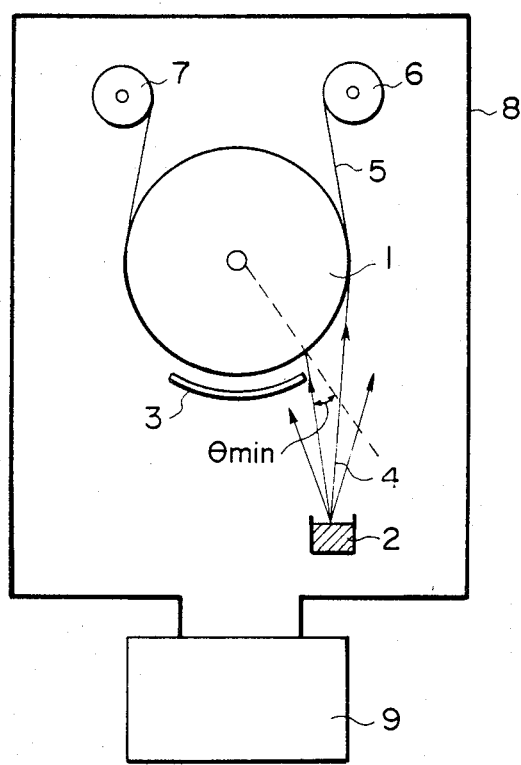
FIG. 1 is a schematic sectional view showing an embodiment of the apparatus for making the magnetic recording medium in accordance with the present invention.

FIG. 1 shows a typical vacuum deposition apparatus used for making a magnetic recording medium, particularly a magnetic tape, by the oblique incidence vacuum deposition method. In FIG. 1, a cylindrical cooling can 1 and a deposition material 2 are positioned in face-to-face relation in a vacuum tank 8. Between the cylindrical cooling can 1 and the deposition material 2 is positioned a mask 3 for determining the angle of incidence of a vapor stream 4. The deposition material 2 for forming a desired ferromagnetic layer is contained in a water-cooled copper hearth or a crucible made of ceramic or the like, and should preferably be heated with an electron beam. When exposed to and heated by an electron beam, the deposition material 2 is fused and evaporated to form the vapor stream 4, which is deposited on a substrate 5.

In the present invention, in order to form a Co—Cr alloy film or a Co—Ni—Cr alloy film, an amount of a Co—Cr or Co—Ni—Cr alloy material having the desired composition may be charged into the hearth or the crucible all at one time. Alternatively, A Co—Cr or Co—Ni—Cr alloy, or a material composition containing at least one of Co—Cr or Co—Ni—Cr may be continuously or intermittently replenished to the hearth or the crucible in the form of a wire, a rod, or the like. It is also possible to use a multiple material simultaneous deposition method wherein two or more deposition materials comprising a combination of Co and Cr or a combination of Co, Ni and Cr are positioned in the vacuum tank 8 and simultaneously evaporated to form a Co—Cr film or a Co—Ni—Cr film having a desired composition. The composition of the Co—Cr film or the Co—Ni—Cr film as a whole should be controlled accurately.

By "minimum angle of incidence" is meant the minimum angle of incidence ($\theta$min) defined by the mask 3 among the angles ($\theta$) of the vapor streams 4 evaporated from the deposition material 2 with respect to the line normal to the surface of the substrate 5.

In general, as shown in FIG. 1, when the cylindrical cooling can 1 is rotated and a portion of the substrate 5 is moved therealong from a feed roll 6 during oblique incidence deposition, the angle of incidence ($\theta$) changes from a larger angle (about 90°) to a smaller angle. When the aforesaid portion of the substrate 5 goes beyond the point where the angle of incidence ($\theta$) is equal to the minimum angle of incidence ($\theta$min), deposition on the aforesaid portion is finished, and the aforesaid portion is wound up around a wind-yp shaft 7.

The vacuum tank 8 is evacuated by an evacuation system 9. In general, deposition should preferably be conducted in a vacuum of $2 \times 10^{-4}$ Torr of less.

The minimum angle of incidence ($\theta$min) is an important factor determining the density and magnetic characteristics, particularly the coercive force Hc, of the layer of obliquely deposited magnetic crystals. In the present invention, $\theta$min should be selected so that the density of the obliquely deposited film is 5.0 g/cm³ or more. Actually, $\theta$min is determined with respect to the coercive force and the time stability. In the experiments conducted by the inventors, a density of 5.0 g/cm³ or more was obtained when $\theta$min was 45° or less. However, $\theta$min may be changed slightly according to the depositing conditions. The substrate 5 should preferably be made of a non-magnetic high-molecular material such as polyethylene terephthalate or polyimide.

The ferromagnetic material constituting the magnetic layer of the magnetic recording medium in accordance with the present invention should preferably be Co or a Co—Ni alloy added with Cr in an amount within the range of 2 to 8 at. %. The Co—Ni alloy should preferably contain Ni in an amount within the range of 0 to 25 at. %. The ferromagnetic material may further contain a trace amount of an additive or oxygen originating from natural oxidation insofar as the characteristics of the Co—Nr or Co—Ni—Cr alloy composition are not affected thereby.

In the present invention, the thickness of the layer of obliquely deposited magnetic crystals should preferably be within the range of 500Å to 5,000Å. The magnetic recording medium in accordance with the present invention may comprise a single magnetic layer or two or more magnetic layers. Further, the magnetic layer or layers may be combined with an intermediate layer and/or a base layer. The magnetic layer side or the substrate side of the magnetic recording medium may be treated to improve various characteristics for practical purposes.

The present invention will now be illustrated by the following nonlimitative example.

EXAMPLE

Oblique incidence deposition was conducted using an alloy material consisting of 76 at. % of Co, 19 at. % of Ni and 5 at. % of Cr. The 16kW electron beam method was used for evaporating the alloy material. Deposition was conducted at a pressure of $5 \times 10^{-5}$ Torr or less by use of an apparatus as shown in FIG. 1. As the substrate, a polyethylene terephthalate base having a thickness of about 10$\mu$ was used. The base conveying speed was about 10 m/min, and $\theta$min was changed within the range of 30° to 60°. The power of the evaporating section was controlled so that the thickness of the deposited film was about 1,300Å. The angle of incidence of the vapor stream was continuously changed from a larger angle to a smaller angle.

The composition of the obliquely deposited film was quantitatively analyzed by use of an X-ray microanalyzer.

As for the measured values, proportions of only Co, Ni and Cr are indicated in FIG. 2, and the proportion of oxygen which would be contained in a very small amount due to natural oxidation is not indicated for reasons of the accuracy of the X-ray micro-analyzer.

Since the vapor pressures of Co and Ni are approximately equal to each other, it was found that Co and Ni were deposited on the substrate in approximately a constant composition ratio of Ni/(Co+Ni)$\approx$0.2. However, since the vapor pressure of Cr is higher than the vapor pressures of Co and Ni, the amount of Cr deposited was larger at the original stage of deposition and smaller at the latter stage of deposition. Therefore, when Co—Ni—Cr was deposited on a long substrate, a Co—Ni—Cr film wherein the concentration of Cr was changed continuously was obtained, and the concentration of Cr could be changed approximately continuously from 1 at. % to 30 at. %. Further, samples were prepared by changing the position of the mask within the range of 30° to 60° while the concentration of Cr was changed. The density of the deposited film thus obtained was within the range of about 4.5 to 6.5 g/cm$^3$.

After the analysis of composition using the X-ray micro-analyzer, the density, time stability, electromagnetic transducing characteristics and magnetostatic characteristics of the obliquely deposited film obtained as described above were evaluated. In the density measurement, the density was calculated from the thickness of the obliquely deposited film (measured by the feeler method) and the measured weight of the film per unit area.

The time stability was evaluated by measuring the degree of thermal demagnetization ($\Delta\phi m/\phi m$ wherein $\phi m$ denotes the degree of magnetization before the thermal test, and $\Delta\phi m$ designates the difference in the degree of magnetization before and after the thermal test) when the obliquely deposited film was maintained at a temperature of 60° C. and relative humidity of 90% for one week.

FIG. 2 shows the data on the degree of thermal demagnetization thus obtained. In the case of the composition comprising 80 at. % of Co and 20 at. % of Ni but containing no Cr (curve 1), $\Delta\phi m/\phi m$ was within the range of $-18\%$ to $-12\%$ when the density was within the range of 4.3 g/cm$^3$ to 6.1 g/cm$^3$, and it was found that this composition is not suitable for practical use. Hc was within the range of about 1,000 to 400 Oe.

In the case of the Co—Ni—Cr composition containing Cr in an amount of 8 at. % (curve 4), there was a tendency of the degree of thermal demagnetization to decrease slightly, but a marked improvement could not be obtained when the density was within the range of 4.3 g/cm$^3$ to less than 5.0 g/cm$^3$.

However, when the density was 5.0 g/cm$^3$ or more, the degree of thermal demagnetization of the Co—Ni—Cr composition was decreased markedly. Particularly when the amount of Cr added was 3 at. % or more, $\Delta\phi m/\phi m$ could be improved to $-5\%$ or less.

When the amount of Cr added was 8 at. % or more, the magnetic flux density was decreased considerably.

The deposited film obtained as described above was slitted to obtain tapes having a width of ½ inch, which were then loaded in a VHS system small video cassette to measure the electromagnetic transducing characteristics. The samples wherein the amount of Cr added was within the range of 3 to 6 at. % and oblique incidence deposition was conducted at $\theta$min of 43° exhibited a coercive force Hc of 1,000 Oe or more when the density was 5.3 g/cm$^3$ or more, and a signal-to-noise ratio equivalent to or higher than the signal-to-noise ratio of the tapes based on a compositon consisting of 80 at. % of Co and 20 at. % of Ni obliquely deposited at $\theta$min of 60°. Further, these samples exhibited very excellent time stability and a very little decrease in the signal-to-noise ratio compared with the tapes based on a composition consisting of 80 at. % of Co and 20 at. % of Ni.

In addition to the experiments on the cases wherein Ni/Co+Ni≈0.2 (curve 1), experiments were conducted in the same way also on the cases wherein Ni/Co+Ni was 0, 0.05, 0.10, 0.25 and 0.3. These experiments revealed that, through the coercive force and the magnetic flux density are changed slightly, approximately the same level of time stability can be obtained when the density is 5.0 g/cm$^3$ or more.

As described above, it was found that the layer of obliquely deposited magnetic crystals wherein Cr is added in an amount within the range of 2 to 8 at. % to Co or a Co—Ni based alloy (Ni: 0 to 25 at. %) and the density is 5.0g/cm$^3$ or more exhibits excellent electromagnetic transducing characteristics and still has excellent time stability.

We claim:

1. A magnetic recording medium comprising a non-magnetic substrate and at least one layer of obliquely deposited magnetic crystals having a curved columnar structure which contains, as a main constituent, Co or a Co—Ni based alloy containing Cr in an amount within the range of 2 to 8 atom % and has a density of 5.0 g/cm$^3$ or more, said layer being formed on said non-magnetic substrate.

2. A magnetic recording medium as defined in claim 1 wherein said Co—Ni based alloy contains Ni in an amount within the range of 0 to 25 atom %.

3. A magnetic recording medium as defined in claim 1 wherein the thickness of said layer is within the range of 500 Å to 5,000Å.

4. A magnetic recording medium as defined in claim 1 wherein said non-magnetic substrate is made of a high-molecular material.

* * * * *